United States Patent
Liu et al.

(10) Patent No.: US 10,629,803 B2
(45) Date of Patent: Apr. 21, 2020

(54) HALL ELEMENT FOR 3-D SENSING AND METHOD FOR PRODUCING THE SAME

(71) Applicant: GLOBALFOUNDRIES Singapore Pte. Ltd., Singapore (SG)

(72) Inventors: Bin Liu, Singapore (SG); Eng Huat Toh, Singapore (SG); Ruchil Kumar Jain, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/399,393

(22) Filed: Apr. 30, 2019

(65) Prior Publication Data

US 2019/0259936 A1 Aug. 22, 2019

Related U.S. Application Data

(62) Division of application No. 15/661,826, filed on Jul. 27, 2017, now Pat. No. 10,333,056.

(51) Int. Cl.
| | |
|---|---|
| G01R 33/07 | (2006.01) |
| H01L 43/04 | (2006.01) |
| H01L 43/06 | (2006.01) |
| H01L 43/14 | (2006.01) |
| G01R 33/02 | (2006.01) |
| G01R 33/00 | (2006.01) |
| H01L 27/22 | (2006.01) |

(52) U.S. Cl.
CPC .......... *H01L 43/04* (2013.01); *G01R 33/0052* (2013.01); *G01R 33/0206* (2013.01); *G01R 33/077* (2013.01); *H01L 27/22* (2013.01); *H01L 43/065* (2013.01); *H01L 43/14* (2013.01)

(58) Field of Classification Search
CPC ............ H01L 21/71–765; H01L 43/04; H01L 43/065; H01L 43/14
See application file for complete search history.

(56) References Cited

U.S. PATENT DOCUMENTS

| | | | |
|---|---|---|---|
| 10,050,082 B1* | 8/2018 | Liu ...................... | H01L 27/22 |
| 2010/0219821 A1 | 9/2010 | Rocznik et al. | |
| 2014/0175528 A1 | 6/2014 | Zieren et al. | |
| 2015/0357561 A1 | 12/2015 | Toh et al. | |
| 2016/0003923 A1 | 1/2016 | Zieren et al. | |

(Continued)

OTHER PUBLICATIONS

Pascal et al., "3D Hall probe integrated in 0.35 μm CMOS technology for magnetic field pulses measurements", Institut d'Electronique du Solide et des Systèmes (InESS), ULP Strasbourg—CNRS—UMR7163, France, retrieved on Mar. 30, 2017 from http://homepages.laas.fr/parra/NEWCAS-TAISA08_PROCEEDINGS/PAPERS/25.pdf, 3 pages.

(Continued)

*Primary Examiner* — Eric A. Ward
(74) *Attorney, Agent, or Firm* — Ditthavong & Steiner P.C.

(57) ABSTRACT

A method of forming a 3D Hall effect sensor and the resulting device are provided. Embodiments include forming a p-type well in a substrate; forming a first n-type well in a first region surrounded by the p-type well in top view; forming a second n-type well in a second region surrounding the p-type well; providing n-type dopant in the first and second n-type wells; and providing p-type dopant in the p-type well and the first n-type well.

17 Claims, 14 Drawing Sheets

(56) References Cited

U.S. PATENT DOCUMENTS

2017/0271399 A1 9/2017 Lee et al.
2018/0315919 A1 11/2018 Ogawa et al.

OTHER PUBLICATIONS

Dimitrov, "3-D Hall Sensor for use in Navigation Systems for Surgery Endovascular Interventions", Published in Intelligent Data Acquisition and Advanced Computing Systems: Technology and Applications, 2007. IDAACS 2007. 4th IEEE Workshop on Sep. 6-8, 2007, retrieved on Mar. 30, 2017 from http://ieeexplore.ieee.org/document/4488499/, 4 pages.

Wouters et al. "Sensors and Actuators A: Physical"—"Design and fabrication of an innovative three-axis Hall sensor", retrieved on Mar. 30, 2017 from https://www.journals.elsevier.com/sensors-and-actuators-a-physical, 10 pages.

* cited by examiner

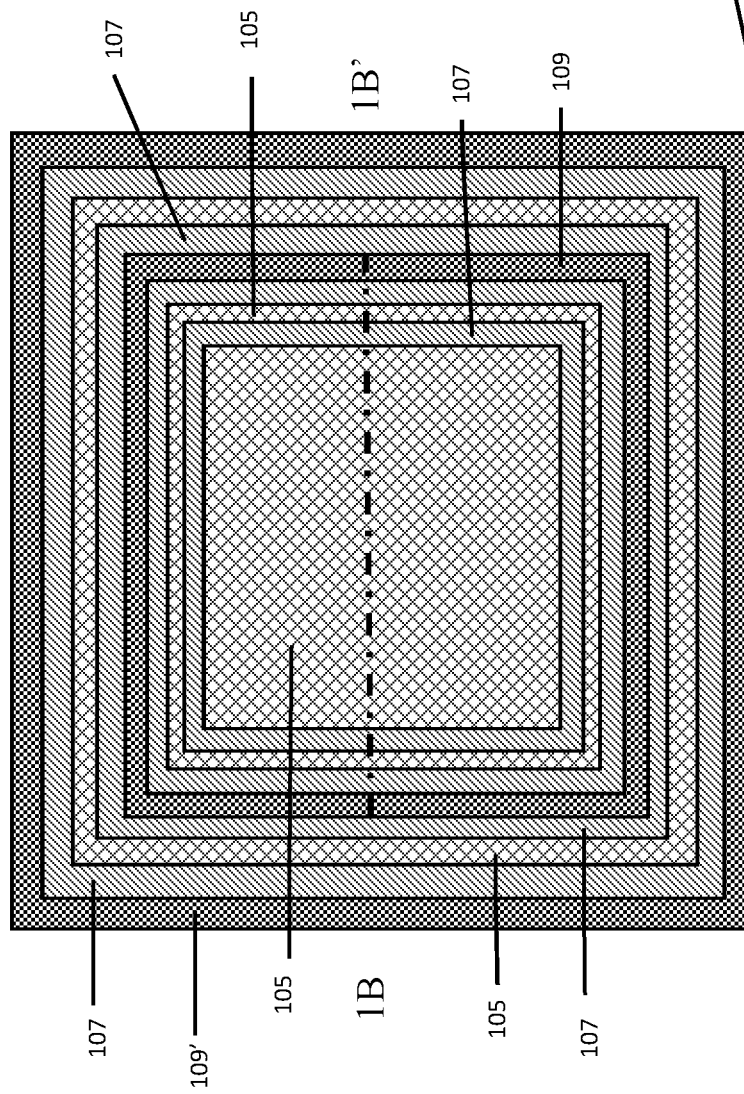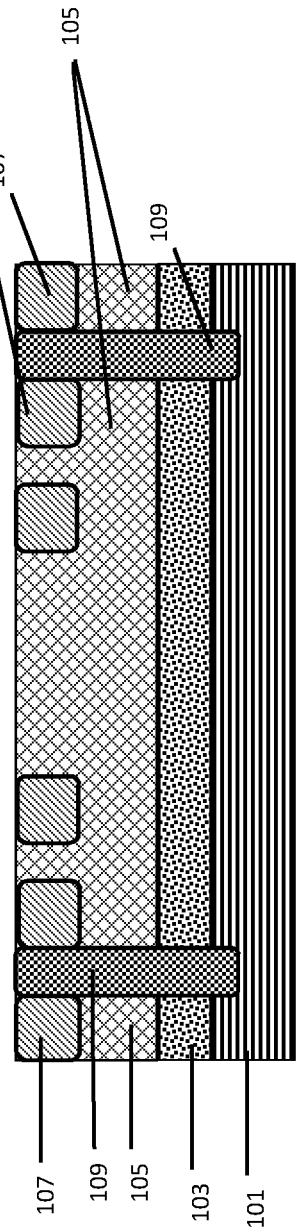
FIG. 1A
FIG. 1B

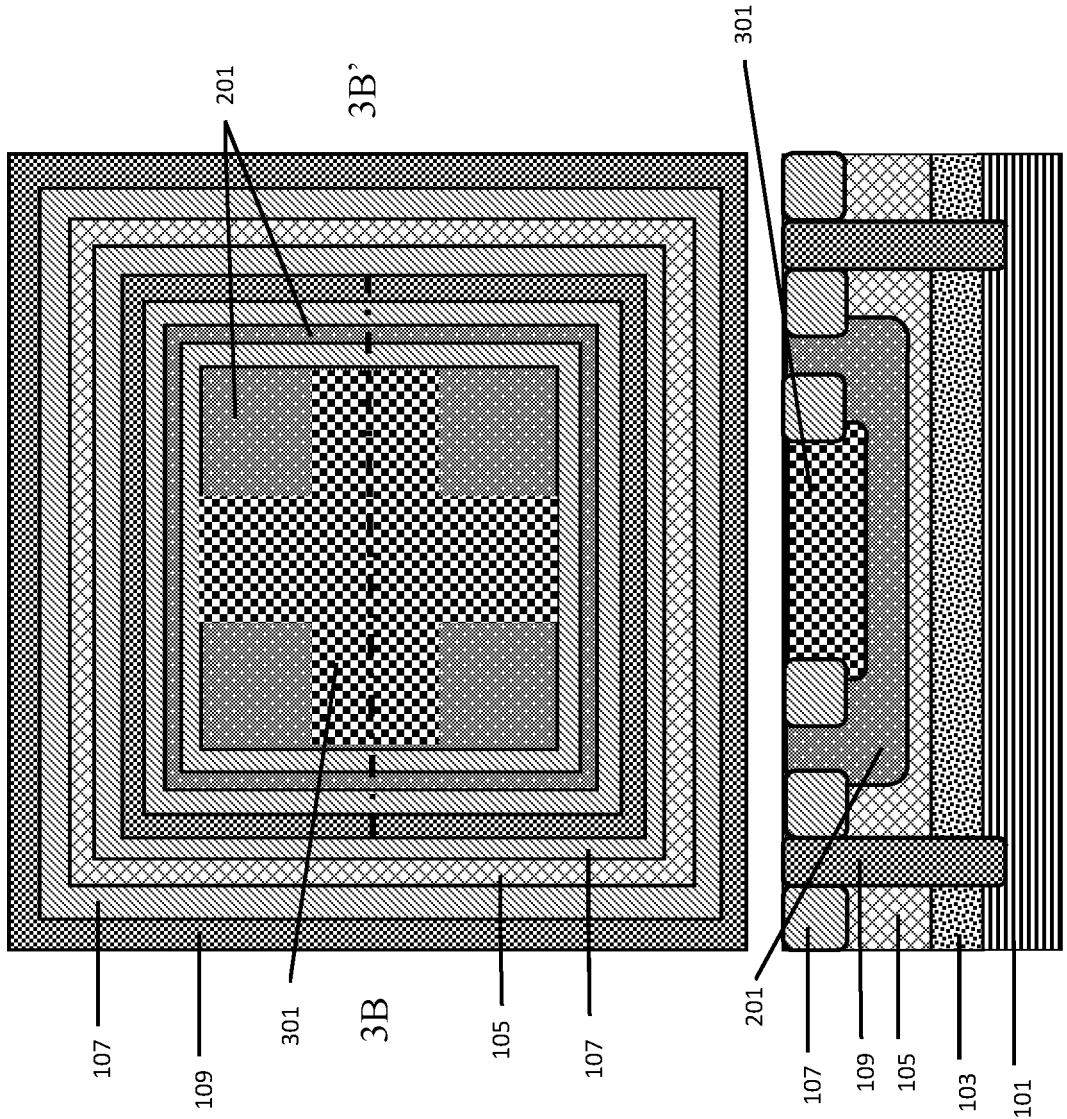

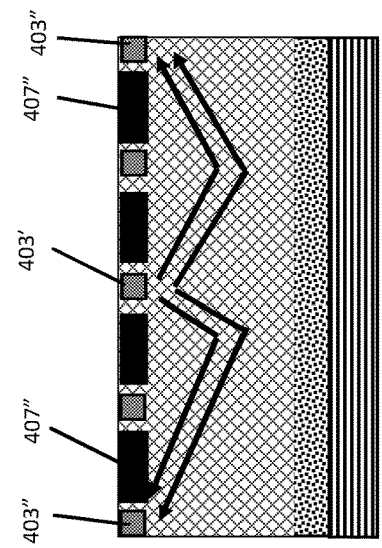
FIG. 7C
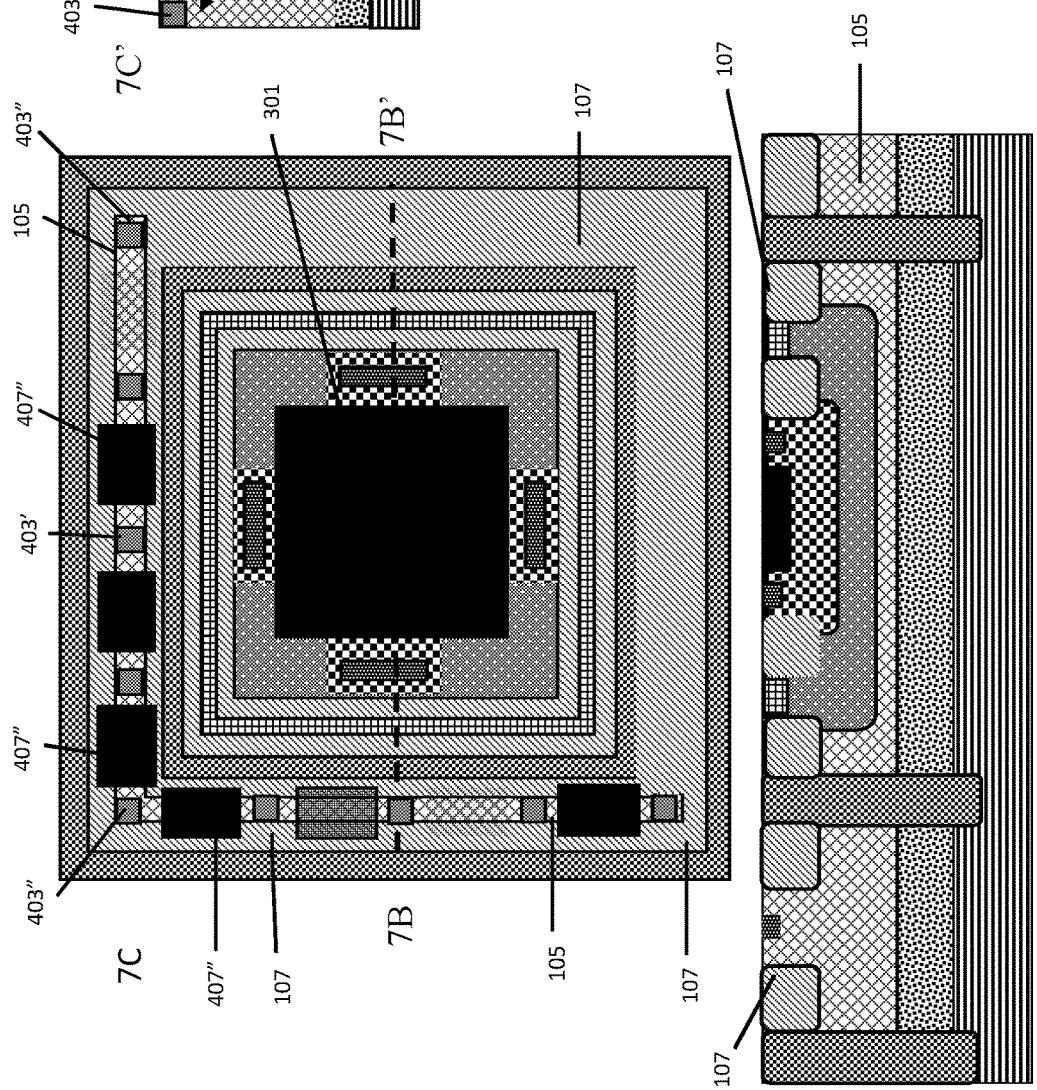
FIG. 7A
FIG. 7B

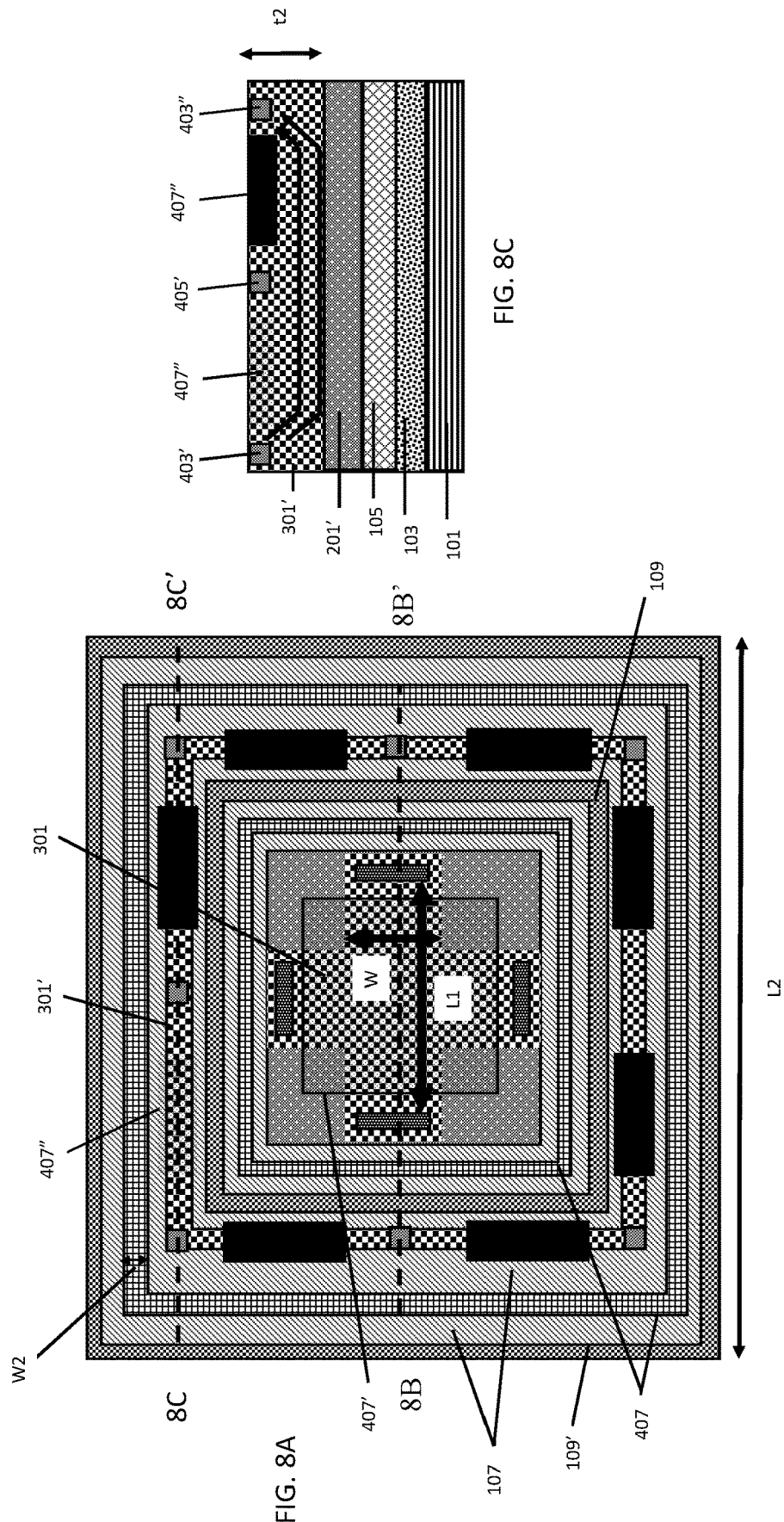

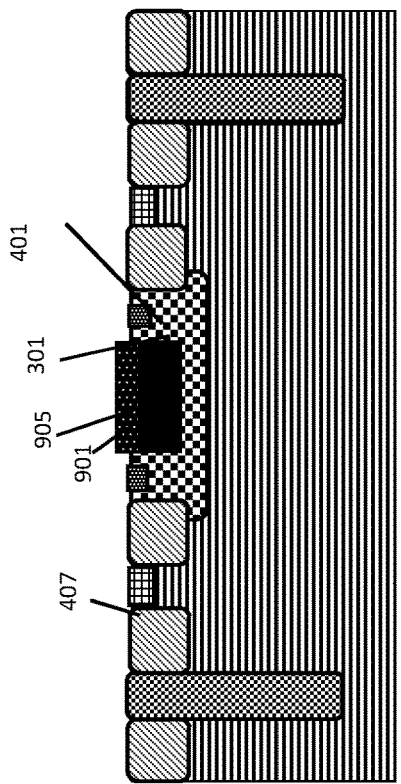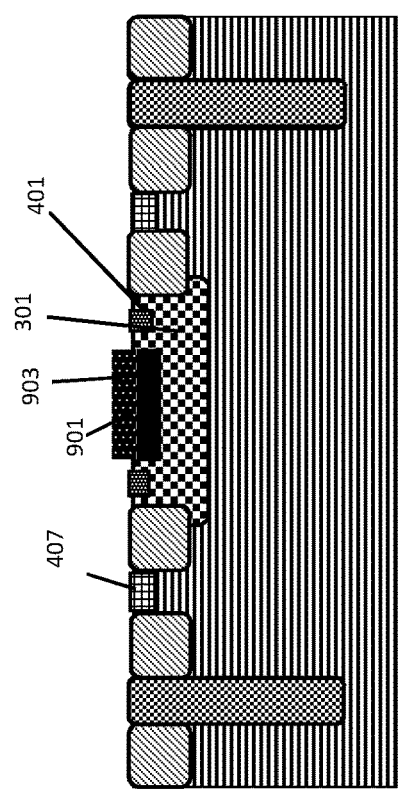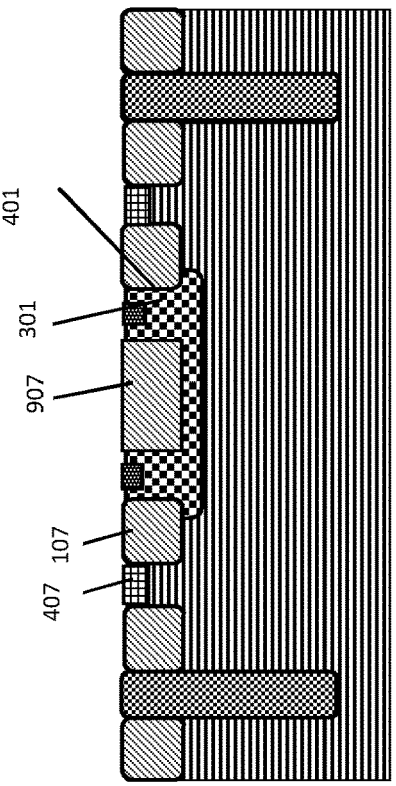

HALL ELEMENT FOR 3-D SENSING AND METHOD FOR PRODUCING THE SAME

RELATED APPLICATION

The present application is a Divisional of U.S. application Ser. No. 15/661,826, filed on Jul. 27, 2017, which is incorporated herein by reference in its entirety.

TECHNICAL FIELD

The present disclosure relates to semiconductor fabrication. In particular, the present disclosure relates to hall elements integrated into semiconductor devices in advanced technology nodes.

BACKGROUND

A Hall effect is the production of a voltage difference (the Hall voltage) across an electrical conductor, transverse to an electric current in the conductor, and a magnetic field perpendicular to the current. When a current-carrying semiconductor is kept in a magnetic field, the charge carriers of the semiconductor experience a force in a direction perpendicular to both the magnetic field and the current. At equilibrium, a voltage appears at the semiconductor edges. The formula for the Hall coefficient becomes more complex in semiconductors where the carriers are generally both electrons and holes which may be present in different concentrations and have different mobilities.

Hall effect sensors are used as proximity sensors, slide-by switch sensors, wheel speed sensors, and brushless DC motor sensors in a variety of industries. Hall sensors are used in the household appliances, gaming systems, construction equipment, utility meters and in the automotive industry as magnetic sensors for position measurements. Traditional mechanical based switches tend to wear out over many "close"/"open" operations, having long-term reliability issues. Hall effect sensors offer excellent long-term reliability since they can operate without the need to have any contacting mechanical parts and are beneficial for automotive applications which have stringent reliability requirements.

One-dimensional (1D) Hall effect sensors sense a magnetic field perpendicular to the chip. Three-dimensional (3D) sensors are advantageous over 1D sensors, since fewer 3D sensors can be used, thereby saving space, time, and cost. 3D Hall effect sensors are an improvement over 1D sensors, since they sense a magnetic field both perpendicular and in-plane to the chip. 3-Axis Hall sensors are integrated 1D and two dimensional (2D) elements and assembled from six building blocks, thereby making the assembly process too complicated, and the resulting sensor is undesirably large. Further, with 3-Axis sensors, the magnetic field may not be sensed in one common region. For a multiple contact Hall sensor, each sensing terminal is a result or under the influence of at least two magnetic fields, which leads to cross interference. Moreover, with existing 3D Hall sensors, the employment of one n-type element makes it more difficult to design planar and vertical Hall elements for sensitivity optimization.

A need therefore exists for devices and methodology enabling 3D Hall effect sensor integration to improve accuracy and sensing, and to reduce cost and cross-interference, and the resulting devices.

SUMMARY

An aspect of the present disclosure is a Hall element for 3D sensing with reduced cross-interference and better design flexibility, and enabling methodology. Another aspect of the present disclosure is a Hall element for sensing in a single concentrated region with reduced interference with separate sensing for each magnetic field component. Yet another aspect of the present disclosure includes individual optimization of vertical and planar Hall elements. Further aspects include reducing doping or thickness of a vertical Hall element to significantly improve sensitivity, without affecting the planar Hall element. Another aspect of the present disclosure includes a Hall element with current tool and process capabilities, such as deep trench isolation (DTI), without any additional masks. A Hall element of the present disclosure is compatible with complimentary metal oxide semiconductors (CMOS) in the 180 nanometer (nm) technology node and beyond, including BCD or BCD lite technology which incorporates analog components (Bipolar), digital components (CMOS) and high-voltage transistors (DMOS) on the same die.

A Hall element of the present disclosure achieves good sensitivity with no cross interference, without adding any additional mask. Individual optimization of planar and vertical Hall elements is achieved. The thickness of the vertical Hall element improves sensitivity without affecting the planar Hall element.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a shallow trench isolation (STI) region and a DTI region in a substrate; forming a p-type well in the substrate surrounded by the STI region in top view; forming a n-type well surrounded by the p-type well and DTI region in top view; providing n-type dopant in the n-type well; and providing p-type dopant in the p-type well.

Aspects of the present disclosure include employing a p-type substrate. Other aspects include forming a substrate with n-type substrate (n-sub) implant. Other aspects include forming a substrate with an n-epitaxial growth over an n-sub implant. Additional aspects include forming the n-type well as a cross-shaped pattern in top view. Further aspects include forming a cover layer over the n-type well. Yet other aspects include forming a cover layer including a p-type cover, STI region, or a layer of local oxidation of silicon (LOCOS). Additional aspects include forming the p-type well to completely surround the cross-shaped n-type well. Other aspects include forming the STI region and DTI region prior to forming the p-type well, wherein the DTI region provides isolation between a planar Hall element located in a first region of the n-epitaxial growth in top view and a vertical Hall element located in a second region of the n-epitaxial growth extending vertically in the device in cross section view, and wherein the second region is disposed between the DTI region and a second DTI region. Another aspect includes forming the n-type well prior to forming the p-type well. Yet another aspect includes forming the n-type well after forming the p-type well. Additional aspects include forming an interlayer dielectric (ILD) over the n-type and p-type wells; performing self-aligned silicidation to reduce resistance in the n-type and p-type wells; forming contacts in the ILD; and performing back-end-of-line (BEOL) processing.

Another aspect of the present disclosure is a device including a STI region and deep DTI region formed in a substrate; a p-type well formed in the substrate between the STI region in top view; a n-type well formed in the substrate and surrounded by the p-type well and DTI region in top view; n-type dopant implanted in the n-type well; and p-type dopant implanted in the p-type well, wherein the device is configured to sense a magnetic field perpendicular and in-plane direction relative to the device.

Aspects of the present disclosure include providing a p-type substrate, including an n-sub implant and an n-epitaxial growth formed over the n-sub implant. Other aspects include the n-type well formed as a cross-shaped pattern in top view. Other aspects include a cover layer formed over the n-type well, wherein the cover layer includes a p-type cover, STI region, or a LOCOS. Further aspects include forming the p-type well to completely surround the cross-shaped n-type well, wherein the DTI region provides isolation between a planar Hall element located in a first region of the n-epitaxial growth in top view and a vertical Hall element located in a second region of the n-epitaxial growth extending vertically in the device in cross section view, the second region is disposed between the DTI region and a second DTI region, and the device is configured for four terminal sensing.

Yet another aspect of the present disclosure is a method including forming a STI region and DTI region in a p-type substrate; forming a p-type well in the substrate surrounded by the STI region in top view; forming a n-type well in a cross shape and surrounded by the p-type well and DTI region in top view; providing n-type dopant in the first n-type well; providing p-type dopant in the p-type well; and optionally forming one or more cover layers over the n-type well.

Aspects of the present disclosure include performing self-aligned silicidation to reduce resistance in the n-type and p-type wells; forming an ILD over the n-type and p-type wells; forming contacts in the ILD; and performing BEOL processing.

According to the present disclosure, some technical effects may be achieved in part by a method including forming a STI region and a DTI region in a substrate; forming a p-type well in the substrate surrounded by the STI region in top view; forming a first n-type well surrounded by the p-type well and DTI region in top view; forming a second n-type well surrounding the p-type well; providing n-type dopant in the first and second n-type wells; and providing p-type dopant in the p-type well.

Additional aspects include providing a p-type substrate having an n-sub implant, and an n-epitaxial growth over the n-sub implant. Aspects include forming the first n-type well as a cross-shaped pattern in top view, wherein the second n-type well surrounds the p-type well along two sides in top view, and the device is configured for three terminal sensing. Other aspects include forming a cover layer over the first n-type well and a plurality of covers over the second n-type well, wherein the cover layer includes a p-type cover, STI region, or LOCOS.

According to the present disclosure, some additional technical effects may be achieved in part by a method including forming a first STI region and a DTI region in a substrate; forming a second STI region in the substrate surrounded by the first STI in top view; forming a first n-type well in the substrate surrounded by the second STI region in top view; providing p-type dopant in a first n-type epitaxial region of the substrate surrounding the second STI region in top view; providing n-type dopant in the n-type well; and forming a second n-type epitaxial region surrounding the first n-type epitaxial region in top view. Aspects include providing a p-type substrate having an n-sub implant, and an n-epitaxial growth over the n-sub implant. Other aspects include forming the n-type well as a cross-shaped pattern in top view; forming one or more cover layers over the n-type well, wherein the cover layer includes a p-type cover, STI region or LOCOS.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A, 2A, 3A, and 4A schematically illustrate top views of a process flow to produce a 3D Hall effect sensor, in accordance with an exemplary embodiment;

FIGS. 1B, 2B, 3B, 4B and 4C schematically illustrate cross-sectional views of FIGS. 1A, 2A, 3A, and 4A, respectively, of a process flow to produce a 3D Hall effect sensor, in accordance with an exemplary embodiment;

FIGS. 7A, 7B and 7C schematically illustrate top and cross sectional views of a 3D Hall effect sensor, in accordance with yet another exemplary embodiment;

FIGS. 8A, 8B, 8C, and 8D schematically illustrate top and cross sectional views of a 3D Hall effect sensor, in accordance with yet other exemplary embodiments;

FIGS. 9A, 9B, 9C, 9D, 9E, 9F, 9G, 9H, 9I, 9J, 9K, and 9L schematically illustrate cross-sectional views of different embodiments of planar Hall element portions of the 3D Hall element.

DETAILED DESCRIPTION

Figures 2A, 2B:
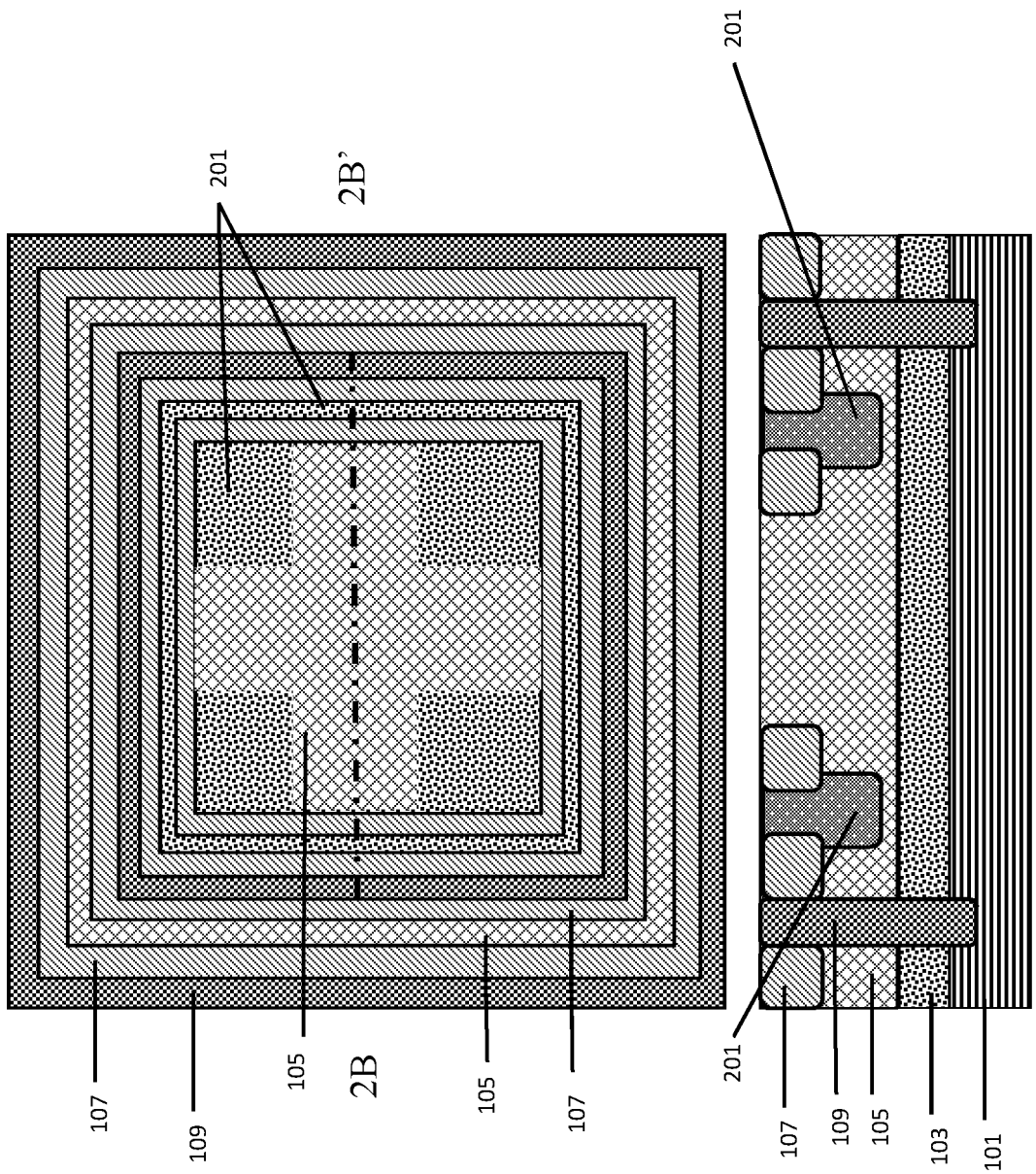

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problems of 1D Hall elements attendant upon sensing a magnetic field in a direction perpendicular to a semiconductor chip. In accordance with embodiments of the present disclosure, a 3D Hall element is provided which provides magnetic field sensing in both perpendicular and in-plane directions relative to the semiconductor chip.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A through 4C schematically illustrate a process flow for forming a 3-D Hall element, in accordance with an exemplary embodiment. FIG. 1B is a cross-sectional view of FIG. 1A along line 1B-1B'. Cross-sectional views of FIGS. 1B, 2B, 3B and 4B illustrate the formation of the planar Hall element. Adverting to FIGS. 1A and 1B, a substrate 101 is provided. The substrate 101 can include a p-type substrate. The substrate 101 can optionally include an n-sub implant 103. The substrate 101 optionally includes an n-epitaxial growth 105 over the n-sub implant 103. Isolation structures, discussed further below, including STI regions 107 and DTI 109 and 109' regions are formed in the substrate 101. The STI regions 107 extend into the n-epitaxial growth 105. The DTI regions 109 and 109' extend through the n-sub implant 103 and n-epitaxial growth 105. DTI region 109' provides isolation between the Hall device and other devices or circuits. DTI region 109 provides isolation between the planar and vertical elements of the Hall device to reduce interference. No additional p-well isolation or tailored deep low doping n-well is needed for the vertical Hall element due to the presence of DTI region 109 surrounding the low doping n-epitaxial growth 105, which makes for a larger effective depth (i.e., larger sensing area) of the vertical Hall element. DTI region 109' provides isolation between Hall sensors and other devices to reduce interferences. High voltage operation of the circuits will not affect the functionalities of Hall devices due to the isolation provided by the DTI 109'. Therefore, less space redundancy is needed in terms of isolation between Hall sensors and other circuits. This is ideal for system-on-chip (SoC) applications.

In FIGS. 2A and 2B, a p-type well 201 is formed in the n-epitaxial growth 105 of substrate 101. FIG. 2B is a cross-sectional view of FIG. 2A along line 2B-2B'. The p-type well 201 is positioned between adjacent STI regions 107 in the cross-sectional view and completely surrounds the n-epitaxial growth 105 in the top view of FIG. 2A.

As shown in FIGS. 3A and 3B, an n-type well 301 is formed in a region surrounded by the p-type well 201 in the top view of FIG. 3A. The n-type well 301 is formed as a cross-shaped pattern in top view, and the p-type well 201 completely surrounds the cross-shaped n-type well 301. FIG. 3B is a cross-sectional view of FIG. 3A along line 3B-3B'. In this embodiment, only one n-type well 301 is formed, but as described further below, an additional n-type well can be formed and can be formed in any order. The p-type well 201 in FIG. 3B is shown extending under the n-type well 301.

Figures 4A, 4B, 4C:
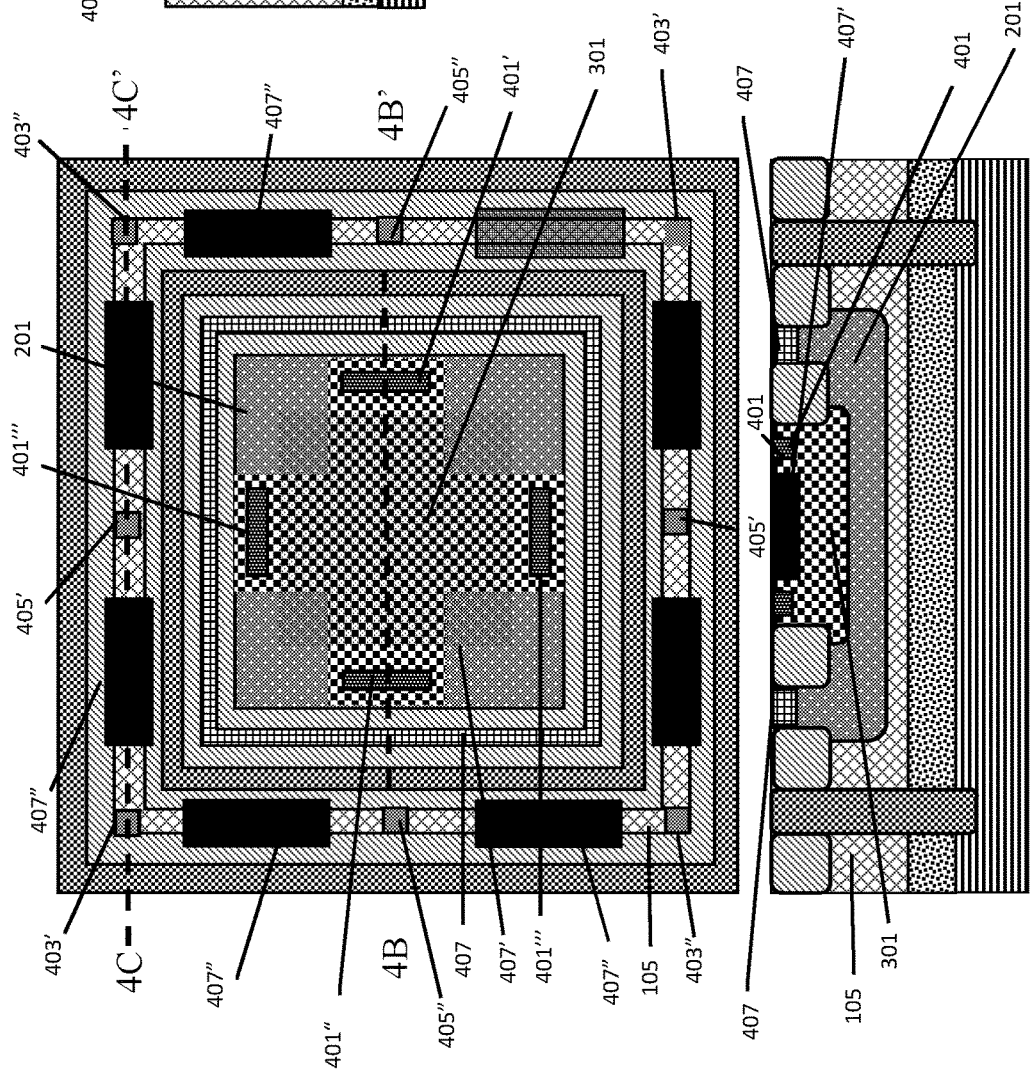

Adverting to FIG. 4A (top view), an n-type dopant 401 is implanted in the n-type well 301 and the n-epitaxial growth 105. The n-type dopant 401 is implanted near the ends of the cross-shaped n-type well 301 and in the n-epitaxial growth 105 at corners and between consecutive corners of the device. The implants can be free from existing technology or dedicated. The n-type implanted regions form terminals 403' and 403" at the corners and terminals 405' between consecutive corners. Contacts can be provided on the N+ layer and above it can be metal lines. Terminals 403' over the n-epitaxial growth 105 are positive (+) and terminals 403" are negative (−). As further shown in FIG. 4A, p-type dopant 407 is a frame around the n-type well 301 inside n-epitaxial growth 105 and a square 407' over the cross-shape n-type well 301. Square 407' is a p-type cover layer formed over the cross-shape n-type well 301. P-type dopant 407 is a plurality of rectangles 407" over n-epitaxial growth 105, wherein rectangles 407" are p-type covers layers. FIG. 4B is a cross-sectional view of FIG. 4A along line 4B-4B'. FIG. 4C is a cross-sectional view of FIG. 4A along line 4C-4C'. FIG. 4B represents the planar Hall element. FIG. 4C is a cross-sectional view representing a vertical Hall element with voltage traveling from positive terminal 403' to negative terminal 403".

Regions 405' are Hall voltage sensing terminals for parallel field perpendicular to 4B-4B' and regions 405" are Hall voltage sensing terminals for parallel field along line 4B-4B'. Terminal 401' over the n-type well 301 is negative (−) and terminal 401" is positive (+). In other examples, the +ve and −ve terminals can be switched as needed. Hall sensing terminals 401''' are positioned at ends of the cross-shaped n-type well 301. In certain examples, Hall sensing terminals 401''' can be exchanged with terminals 401' and 401" to become positive (+) and negative (−) terminals.

As described, the n-type well 301 can be formed prior to forming the p-type well 201. Alternatively, the n-type well 301 is formed after the p-type well 201. Further, the n-type dopant 401 and p-type dopant 407 can be implanted before or after the p-type well 201 and n-type well 301. Following the formation of the p-type well 201 and n-type wells 301, a oxide layer is deposited and patterned to expose selected regions (e.g., all the n+, p+ regions except 407' and 407") for silicidation to reduce contact resistance. Then an ILD (not shown for illustrative convenience) is deposited and contacts are formed in the ILD and BEOL processing steps can be further performed.

Figure 5:
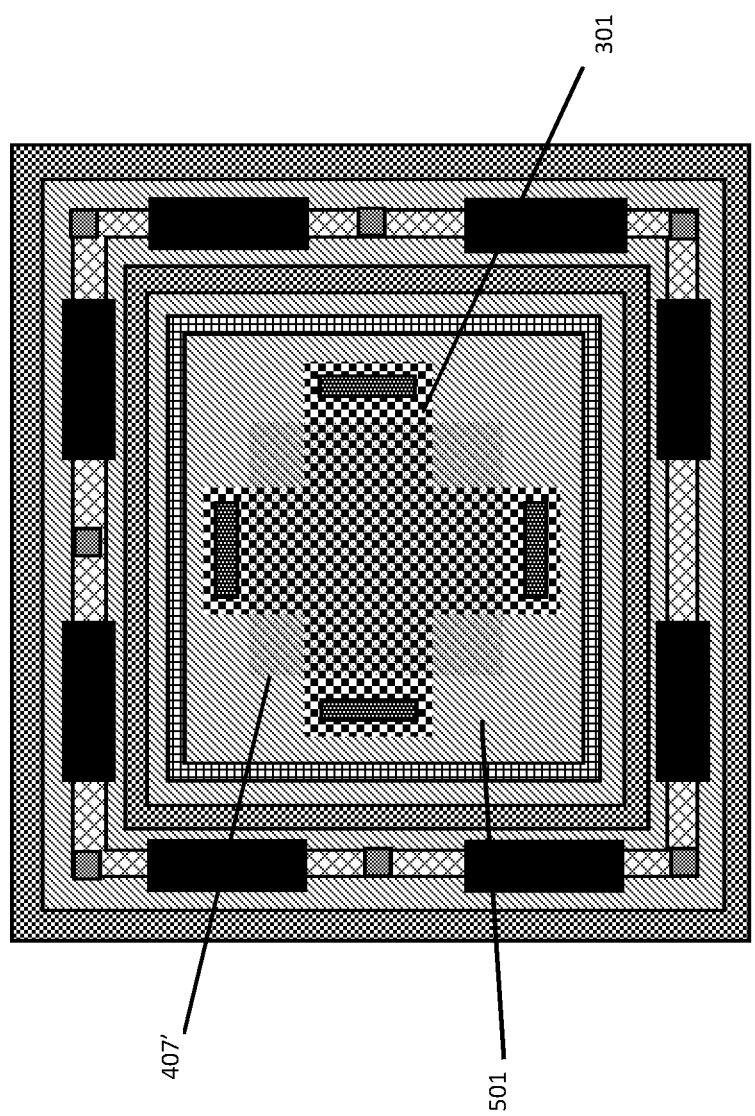
FIG. 5 schematically illustrates a top view of a 3D Hall effect sensor, in accordance with another exemplary embodiment.

Adverting to FIG. 5, an additional structural configuration of the 3D Hall element is illustrated in top view. In this embodiment, the p-type well 201 is replaced with an STI region 501. The STI region 501 surrounds the n-type well 301 in top view.

Figure 6A:
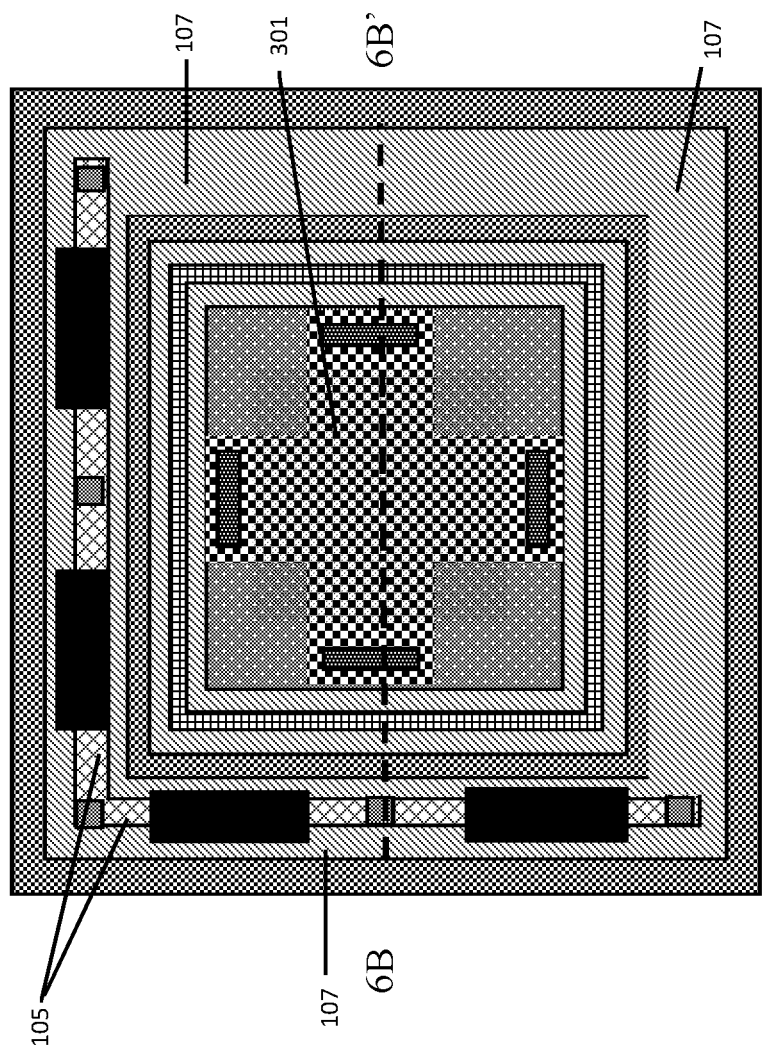
FIGS. 6A and 6B schematically illustrate top and cross sectional views of a 3D Hall effect sensor, in accordance with yet another exemplary embodiment.
Figure 6B:
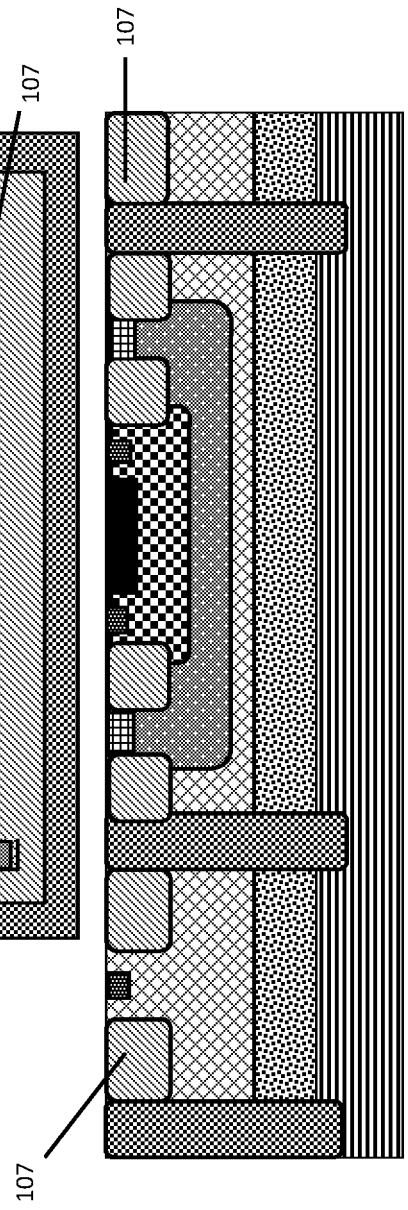

Adverting to FIGS. 6A and 6B, an additional structural configurations of the 3D Hall sensor is illustrated in top view (FIG. 6A) and cross-sectional view (FIG. 6B). FIG. 6B is a cross-sectional view of FIG. 6A along line 6B-6B'. The n-epitaxial growth 105 is surrounded by STI region 107 in top view. This embodiment represents a three-terminal sensing device since the n-epitaxial growth 105 extends only along two sides of the n-type well 301 in top view. The overall device size is smaller since it is configured with three-terminal sensing rather than six-terminal sensing.

FIGS. 7A, 7B and 7C illustrate additional structural configurations of the 3D Hall sensor, in accordance with yet another exemplary embodiment FIG. 7A is illustrated in top view, FIG. 7B is a cross-sectional view of FIG. 7A along line 7B-7B', and FIG. 7C is a cross-sectional view of FIG. 7A along line 7C-7C'. As with the embodiment in FIG. 6A, the n-epitaxial growth 105 is surrounded by STI region 107 in top view, and represents a three-terminal sensing device since the n-epitaxial growth 105 extends only along two sides of the n-type well 301 in top view. In FIG. 7C, terminal 403' over the n-epitaxial growth 105 is positive (+) and terminals 403" are negative (−). FIG. 7C represents a vertical Hall element with voltage traveling from positive terminal 403' to negative terminals 403".

Figure 8B:
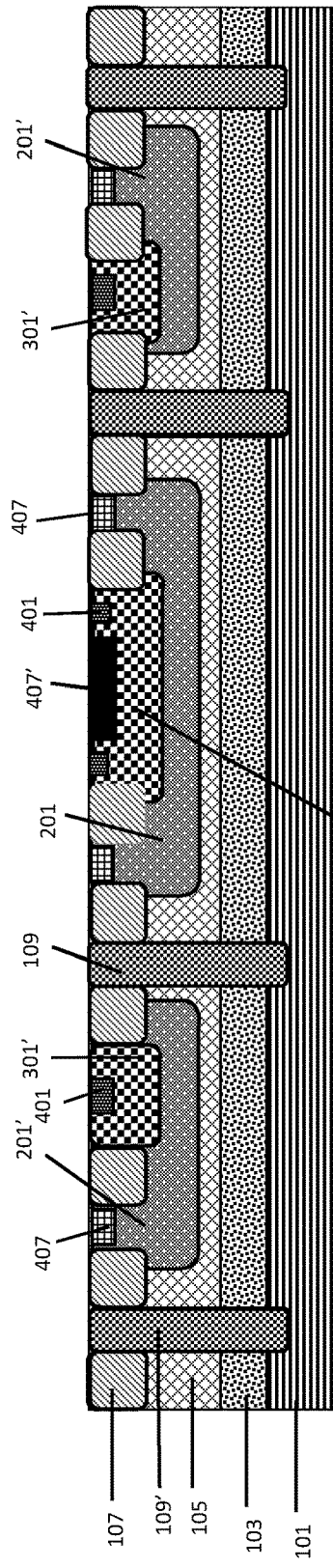

FIGS. 8A, 8B and 8C illustrate additional structural configurations of the 3D Hall sensor, in accordance with yet other exemplary embodiments FIG. 8A is illustrated in top view, FIG. 8B is a cross-sectional view of FIG. 8A along line 8B-8B', and FIG. 8C is a cross-sectional view of FIG. 8A along line 8C-8C'. A second n-type well 301' and second p-type well 201' are provided. In FIG. 8A, as with FIG. 4A, the second n-type well 301' includes n-type implants 401 and the second p-type well 201' includes p-type implants 407. FIG. 8B, as with FIG. 4B, represents a planar Hall element. FIG. 8C, as with FIG. 4C, is a cross-sectional view representing a vertical Hall element with voltage traveling from positive terminal 403' to negative terminal 403" in the second n-type well 301'.

Figure 8D:
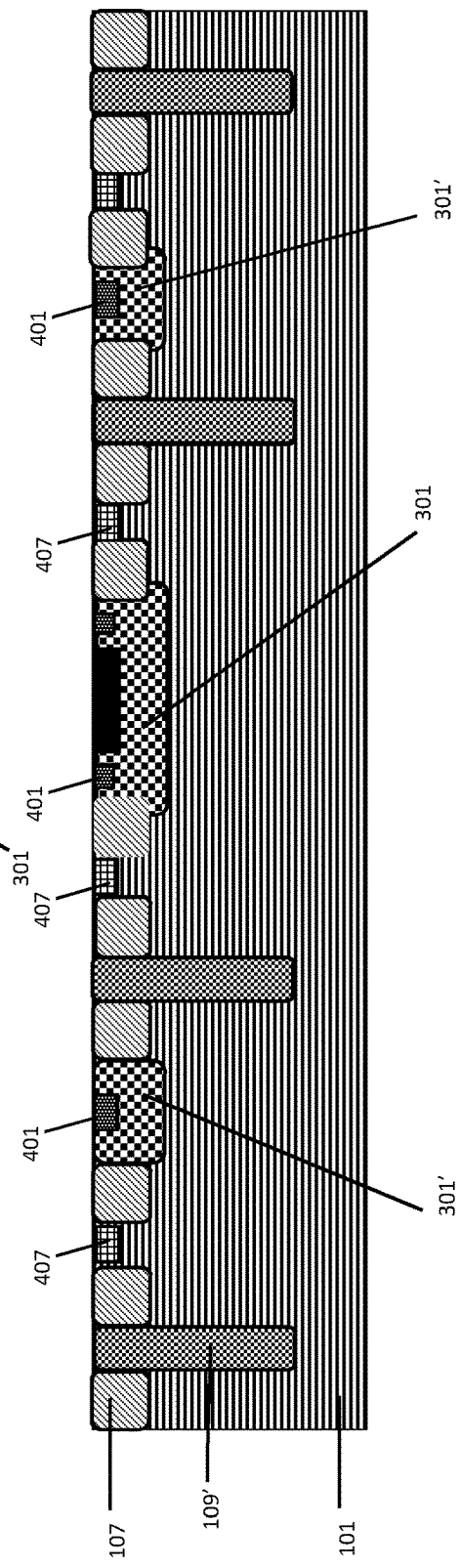

FIG. 8D is a cross-sectional view of FIG. 8A along line 8B-8B', but the substrate 101 includes only a p-type substrate. As such, no additional p-type wells 201 and 201' or n-epitaxial growth 105 are required. The p-type substrate 101 directly contacts the DTI regions 109 and 109' and n-type wells 301 and 301'.

Figure 9B:
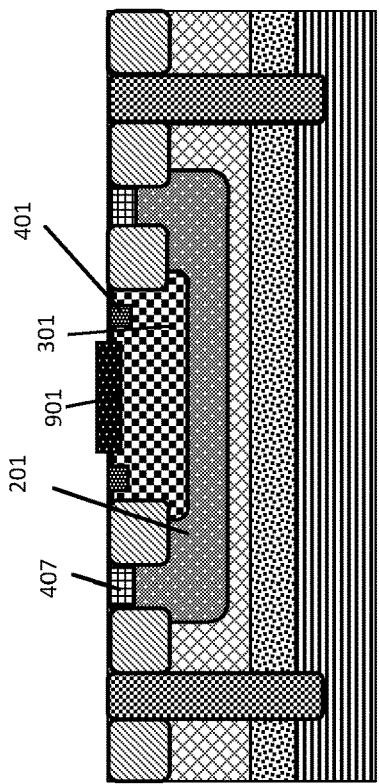
Figure 9A:
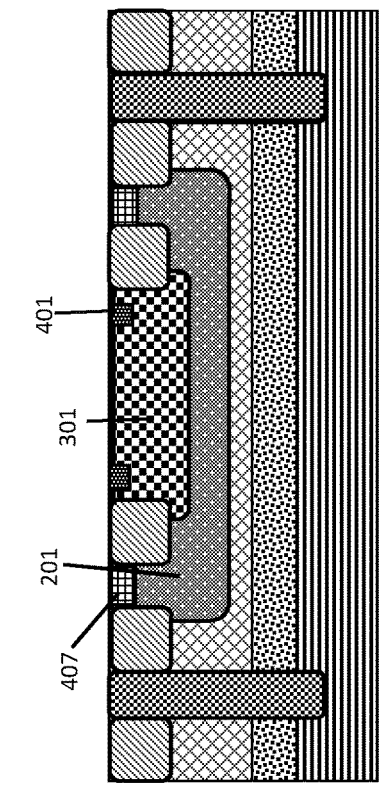
Figure 9C:
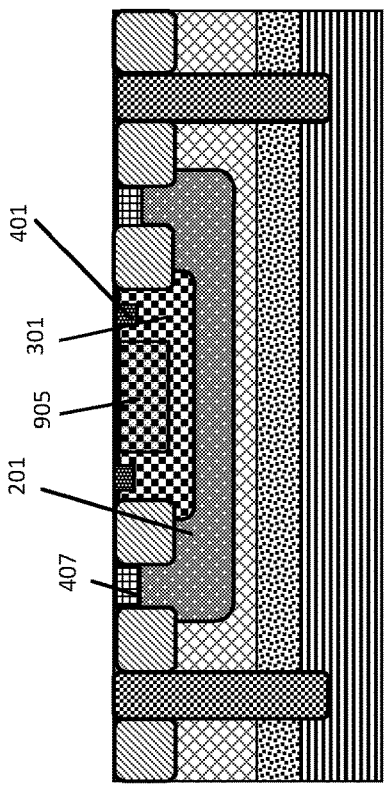
Figure 9E:
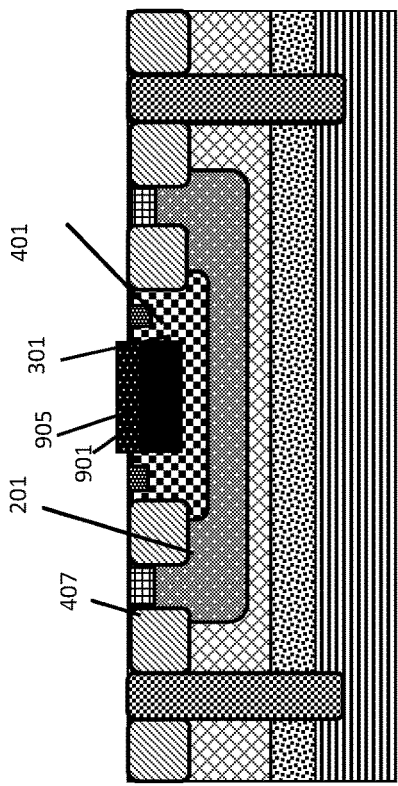
Figure 9D:
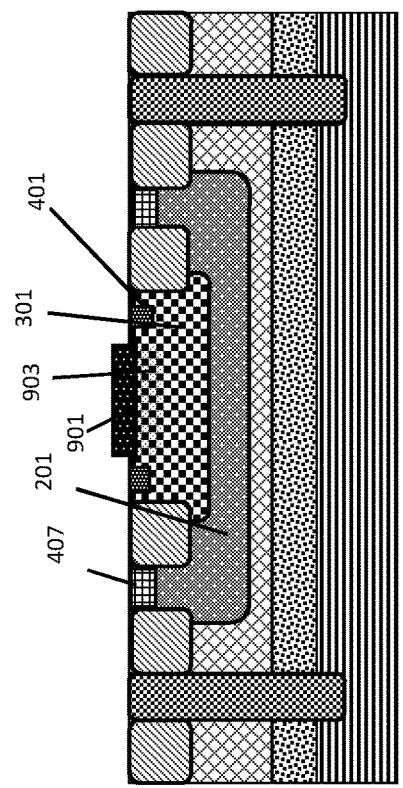
Figure 9F:
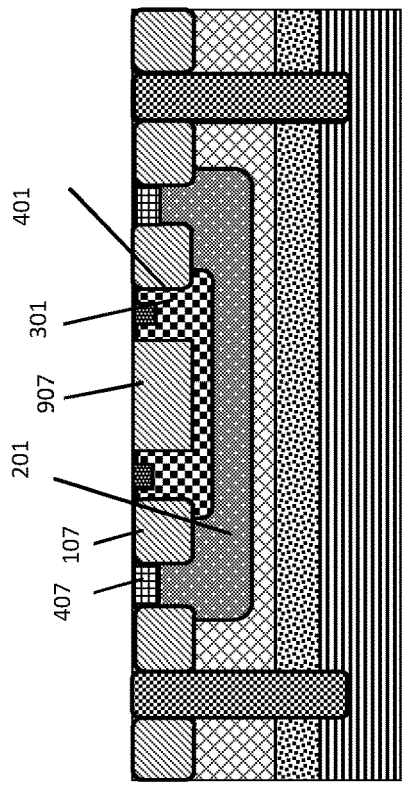
Figure 9H:
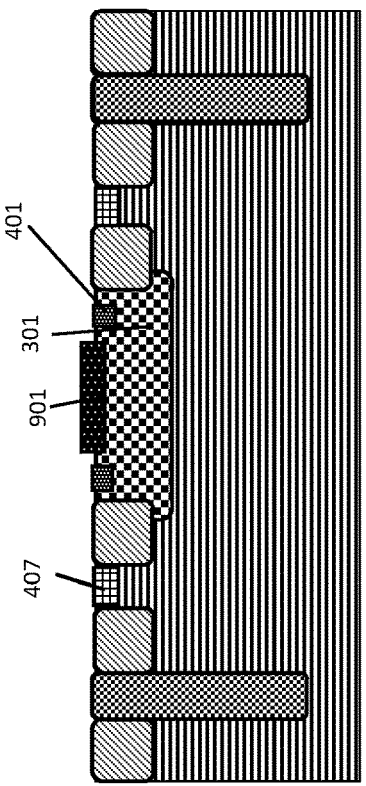
Figure 9I:
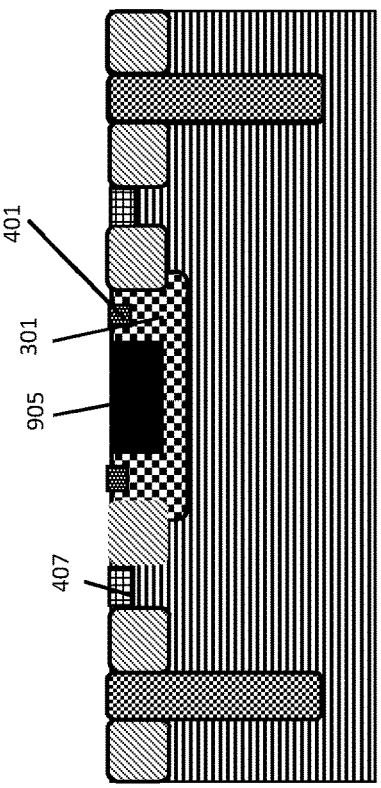
Figure 9G:
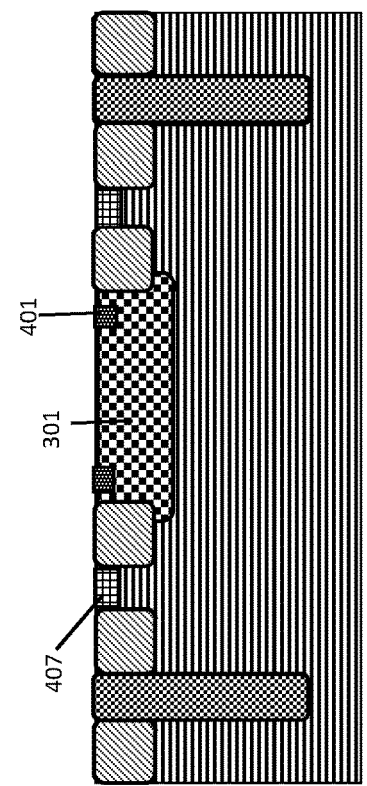

FIGS. 9A, 9B, 9C, 9D, 9E, and 9F schematically illustrate cross-sectional views of different embodiments of planar Hall element portions of the 3D Hall element that can be used in the previous embodiments. In FIG. 9A, no p-type cover 407' is provided over the n-type well 301 for the planar Hall element portion. In FIG. 9B, a LOCOS cover 901 is provided instead of a p-type cover 407'. In FIG. 9C, a thicker p-type cover 905 is provided instead of a p-type cover 407'. A cover 905 is a thicker p-type cover which results in a thinner Hall plate. In FIG. 9D, a combination of LOCOS cover 901 and p-type cover 407' is provided. In FIG. 9E, a combination of LOCOS cover 901 and thicker p-type cover 905 is provided. In FIG. 9F, a STI region 907 is provided instead of a p-type cover 407'.

FIGS. 9G, 9H, 9I, 9J, 9K, and 9L resemble FIGS. 9A, 9B, 9C, 9D, 9E, and 9F, but the substrate 101 includes only a p-type substrate. As such, no additional p-type wells 201 or n-epitaxial growth 105 are required. The p-type substrate 101 directly contacts the DTI regions and n-type wells 301.

Figure 10C:
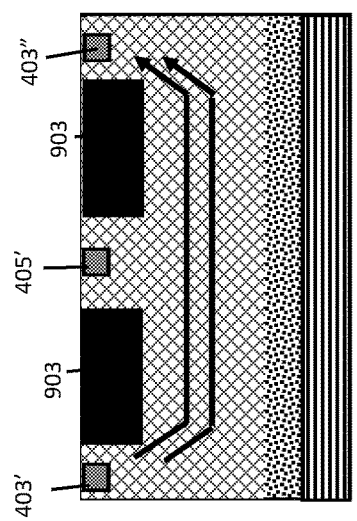
FIGS. 10A, 10B, 10C, 10D, 10E, 10F, and 10G schematically illustrate cross-sectional views of different embodiments of vertical Hall element portions of the 3D Hall element.
Figure 10F:
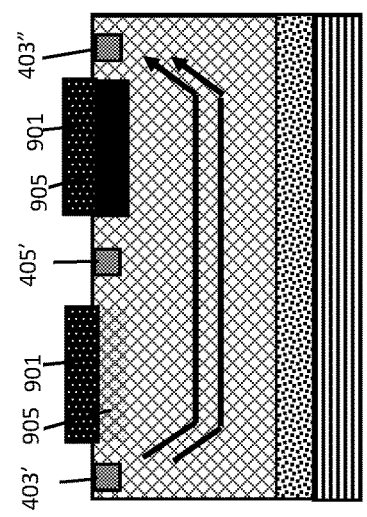
Figure 10B:
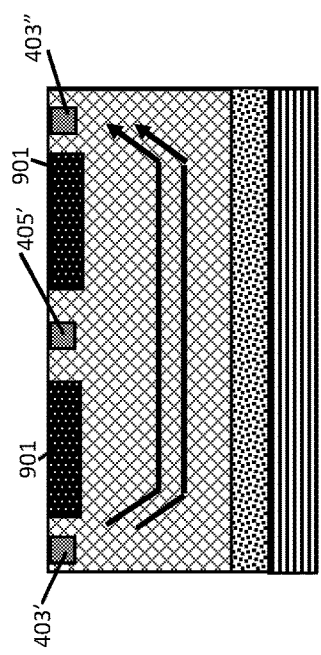
Figure 10E:
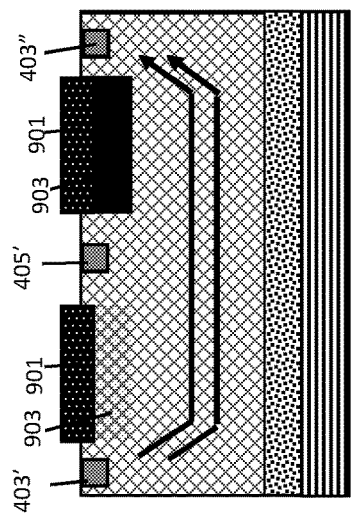
Figure 10G:
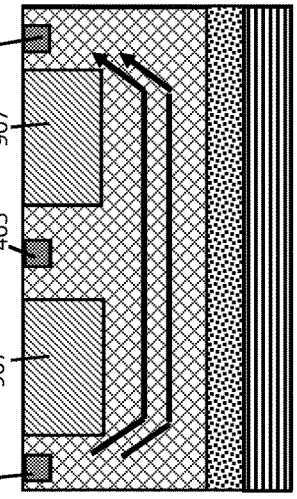
Figure 10A:
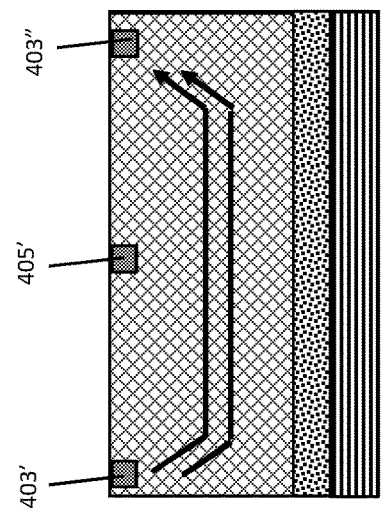
Figure 10D:
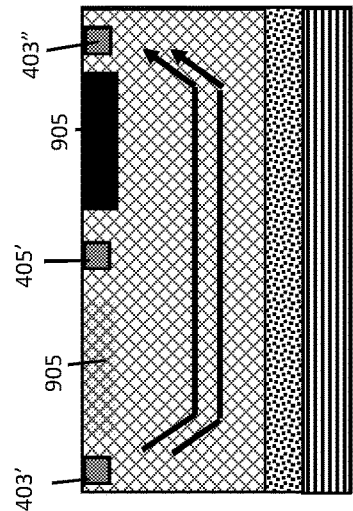

FIGS. 10A, 10B, 10C, 10D, 10E, 10F, and 10G schematically illustrate cross-sectional views of different embodiments of vertical Hall element portions of the 3D Hall element that can be used in the previous embodiments using a single n-type well 301 or both n-type wells 301 and 301'. In FIG. 10A, no p-type cover 407' is provided. In FIG. 10B, LOCOS covers 901 is provided instead of a p-type cover 407'. In FIG. 10C, a thicker p-type layer covers 905 are provided instead of a p-type cover 407'. In FIG. 10D, a combination of LOCOS cover 901 and p-type cover 407' is provided. In FIG. 10E, a combination of LOCOS cover 901 and thicker p-type cover 905 is provided. In FIG. 10F, STI regions 907 are provided instead of a p-type cover 407'. As with the prior embodiments, the vertical Hall element has voltage traveling from positive terminal 403' to negative terminals 403".

The embodiments of the present disclosure achieve several technical effects, including a Hall element for sensing in a single concentrated region with reduced cross-interference with separate sensing for each magnetic field component. Another technical effect includes the individual optimization of vertical and planar Hall elements.

Devices formed in accordance with embodiments of the present disclosure enjoy utility in various industrial applications, e.g., microprocessors, smart-phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices using Hall effect sensors. The present disclosure is particularly applicable in the advanced technology nodes.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a shallow trench isolation (STI) region and a deep trench isolation (DTI) region formed in a substrate;
   a p-type well formed in the substrate between the STI region in a top view;
   a n-type well formed in the substrate and surrounded by the p-type well and the DTI region in the top view;
   n-type dopant implanted in the n-type well; and
   p-type dopant implanted in the p-type well,
   wherein the device is configured to sense a magnetic field perpendicular and in-plane direction relative to the device,
   wherein the n-type well is formed as a cross-shaped pattern in the top view,
   wherein the p-type well is formed to surround the cross-shaped n-type well, and
   wherein the DTI region provides isolation between a planar Hall element located in a first region of n-epitaxial growth in the top view and a vertical Hall element located in a second region of n-epitaxial growth extending vertically in the device in a cross section view.

2. The device according to claim 1, wherein the substrate comprises a p-type substrate.

3. The device according to claim 2, wherein the substrate further comprises a n-type substrate (n-sub) and the n-epitaxial growth formed over the n-sub.

4. The device according to claim 1, further comprising:
   a cover layer formed over the n-type well.

5. The device according to claim 4, wherein the cover layer comprises a p-type cover, STI region or a layer of local oxidation of silicon (LOCOS).

6. The device according to claim 1, wherein the second region is disposed between the DTI region and a second DTI region.

7. The device according to claim 6, wherein the device is configured for four terminal sensing.

8. A device comprising:
   a shallow trench isolation (STI) region and a deep trench isolation (DTI) region formed in a p-type substrate;
   a p-type well formed in the substrate surrounded by the STI region in a top view;
   a n-type well formed in a cross shape and surrounded by the p-type well and the DTI region in the top view;

n-type dopant formed in the first n-type well;
p-type dopant formed in the p-type well; and
one or more cover layers formed over the n-type well,
wherein the DTI region provides isolation between a planar Hall element located in a first region of n-epitaxial growth in the top view and a vertical Hall element located in a second region of n-epitaxial growth extending vertically in the device in a cross section view.

9. The device according to claim 8, further comprising:
an interlayer dielectric (ILD) formed over the n-type and p-type wells; and
contacts formed in the ILD.

10. A device comprising:
a shallow trench isolation (STI) region and a deep trench isolation (DTI) region formed in a substrate;
a p-type well formed in the substrate surrounded by the STI region in a top view;
a n-type well surrounded by the p-type well and the DTI region in the top view;
n-type dopant formed in the n-type well; and
p-type dopant formed in the p-type well,
wherein the DTI region provides isolation between a planar Hall element located in a first region of n-epitaxial growth in the top view and a vertical Hall element located in a second region of n-epitaxial growth extending vertically in the device in a cross section view.

11. The device according to claim 10, wherein the substrate comprises a p-type substrate.

12. The device according to claim 10, wherein the substrate further comprises an n-type substrate (n-sub).

13. The device according to claim 12, wherein the n-epitaxial growth is over the n-sub.

14. The device according to claim 10, wherein the n-type well is formed as a cross-shaped pattern in the top view.

15. The device according to claim 14, further comprising:
a cover layer formed over the n-type well,
wherein the cover layer comprises a p-type cover, or STI region.

16. The device according to claim 15, further comprising:
a layer of local oxidation of silicon (LOCOS) formed over the cover layer or directly on the n-type well.

17. The device according to claim 15, wherein the p-type well is formed to completely surround the cross-shaped n-type well.

* * * * *